(12) United States Patent
Oh et al.

(10) Patent No.: US 9,741,784 B2
(45) Date of Patent: Aug. 22, 2017

(54) ORGANIC LIGHT EMITTING DISPLAY DEVICE AND METHOD OF MANUFACTURING THE SAME

(71) Applicant: Samsung Display Co., LTD., Yongin, Gyeonggi-Do (KR)

(72) Inventors: Eon-Seok Oh, Seoul (KR); Sang-Yeol Kim, Hwaseong-si (KR); Byeong-Min Jang, Suwon-si (KR); Mi-Yeon Cho, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/795,154

(22) Filed: Jul. 9, 2015

(65) Prior Publication Data
US 2016/0211316 A1    Jul. 21, 2016

(30) Foreign Application Priority Data

Jan. 16, 2015  (KR) ........................ 10-2015-0007926

(51) Int. Cl.
| | | |
|---|---|---|
| *H01L 29/08* | (2006.01) | |
| *H01L 29/04* | (2006.01) | |
| *H01L 27/14* | (2006.01) | |
| *H01L 33/00* | (2010.01) | |
| *H01L 27/32* | (2006.01) | |

(Continued)

(52) U.S. Cl.
CPC ........ *H01L 27/3279* (2013.01); *H01L 27/326* (2013.01); *H01L 51/5228* (2013.01); *H01L 51/5234* (2013.01); *H01L 51/56* (2013.01); *H01L 2227/323* (2013.01)

(58) Field of Classification Search
CPC . H01L 27/3279; H01L 51/5234; H01L 51/56; H01L 27/326; H01L 2227/323
USPC .... 257/40, 98, 59, 72, 88, E51.02, E51.018; 438/35; 313/504
See application file for complete search history.

(56) References Cited

U.S. PATENT DOCUMENTS

| | | | | |
|---|---|---|---|---|
| 2002/0158835 | A1* | 10/2002 | Kobayashi | .......... H01L 27/3244 345/100 |
| 2004/0081751 | A1* | 4/2004 | Nakanishi | ............. G02F 1/1345 427/108 |

(Continued)

FOREIGN PATENT DOCUMENTS

| | | |
|---|---|---|
| KR | 1020100042799 A | 4/2010 |
| KR | 101373834 A | 3/2014 |

(Continued)

OTHER PUBLICATIONS

Extended European Search Report for Application No. 15193833.9-1555 dated Jun. 14, 2016.

*Primary Examiner* — Dzung Tran
(74) *Attorney, Agent, or Firm* — Cantor Colburn LLP

(57) ABSTRACT

An organic light emitting display device includes a substrate including a plurality of pixel areas, each of the plurality of pixel areas including a light emitting region and a transmission region, a first electrode disposed on the light emitting region of the substrate, a second electrode opposing the first electrode, an organic light emitting layer which is disposed on the light emitting region of the substrate and disposed between the first electrode and the second electrode, and an auxiliary electrode which is disposed on the transmission region of the substrate and electrically connected to the second electrode.

17 Claims, 17 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 2005/0206309 A1* | 9/2005 | Shibasaki | H01L 27/3276 313/504 |
| 2005/0269945 A1* | 12/2005 | Su | H01L 51/5234 313/504 |
| 2009/0302751 A1 | 12/2009 | Hanawa | |
| 2010/0097295 A1* | 4/2010 | Kwak | H01L 27/322 345/32 |
| 2011/0204369 A1 | 8/2011 | Ha et al. | |
| 2011/0241563 A1* | 10/2011 | Kim | G09G 3/3225 315/291 |
| 2012/0001184 A1 | 1/2012 | Ha et al. | |

FOREIGN PATENT DOCUMENTS

KR 1020140063174 A 5/2014
KR 1020140085979 A 7/2014

\* cited by examiner

ORGANIC LIGHT EMITTING DISPLAY DEVICE AND METHOD OF MANUFACTURING THE SAME

This application claims priority to Korean Patent Application No. 10-2015-0007926, filed on Jan. 16, 2015, and all the benefits accruing therefrom under 35 U.S.C. §119, the content of which in its entirety is herein incorporated by reference.

BACKGROUND

1. Field

Exemplary embodiments relate to organic light emitting display ("OLED") devices and methods of manufacturing the same. More particularly, exemplary embodiments relate to OLED devices having an improved transmittance for external light and methods of manufacturing the same.

2. Description of the Related Art

A display device may generally include a plurality of pixels emitting light so that an image may be displayed. Pixels of an organic light emitting display ("OLED") device may include an organic light emitting diode. The organic light emitting diode may emit light which has a wavelength depending on a type of organic material included therein. The organic light emitting diode may include different types of organic materials for emitting one of red, green and blue colored light, for example. The lights having different colors may be emitted and combined to form a color image in the OLED device.

Recently, OLED devices having a predetermined transmittance have been researched.

SUMMARY

Exemplary embodiments provide an organic light emitting display ("OLED") device including an electrode with a reduced resistance.

Exemplary embodiments provide a method of manufacturing an OLED device including an electrode with a reduced resistance.

According to exemplary embodiments, the OLED device may include a substrate, a first electrode, a second electrode, an organic light emitting layer, and an auxiliary electrode. The substrate may include a plurality of pixel areas. Each of the plurality of pixel areas may include a light emitting region and a transmission region. The first electrode may be disposed on the light emitting region of the substrate. The second electrode may oppose the first electrode. The organic light emitting layer may be disposed on the light emitting region of the substrate. The organic light emitting layer may be disposed between the first electrode and the second electrode. The auxiliary electrode may be disposed on the transmission region of the substrate. The auxiliary electrode may be electrically connected to the second electrode.

In exemplary embodiments, the auxiliary electrode may include a conductive layer and a conductive pattern.

In exemplary embodiments, the conductive layer and the first electrode may include the same material.

In exemplary embodiments, the conductive layer and the first electrode may include at least one of indium tin oxide ("ITO"), indium zinc oxide ("IZO"), zinc oxide (ZnOx), magnesium oxide (MgOx), titanium oxide (TiOx), graphene, a carbon nanotube ("CNT"), PEDOT:PSS and a conductive polymer material.

In exemplary embodiments, bottom surfaces of the conductive layer and the first electrode may be on the same plane, and the conductive layer and the first electrode may be spaced apart from each other.

In exemplary embodiments, the conductive pattern may include a plurality of wires. The plurality of wires may extend in a first direction that is parallel to a top surface of the substrate. The plurality of wires may be spaced apart from each other in a second direction that is perpendicular to the first direction and parallel to the top surface of the substrate.

In exemplary embodiments, the conductive pattern may include a plurality of wires. The plurality of wires may extend in a first direction and a second direction to cross each other. The first direction and the second direction are parallel to a top surface of the substrate and perpendicular to each other.

In exemplary embodiments, a width of each wire among the plurality of wires may be less than a distance between neighboring wires among the plurality of wires.

In exemplary embodiments, the conductive pattern may have a grid arrangement.

In exemplary embodiments, the conductive pattern may include a material having a resistivity less than that of the conductive layer.

In exemplary embodiments, the conductive pattern may include at least one of graphene, a CNT, PEDOT:PSS, a conductive polymer material, a metal nanowire, silver (Ag) and gold (Au).

In exemplary embodiments, the second electrode may include at least one of aluminum (Al), silver (Ag) and magnesium-silver (MgAg).

In exemplary embodiments, the OLED device may further include a hole injection layer between the first electrode and the organic light emitting layer, a hole transport layer between the hole injection layer and the organic light emitting layer, an electron injection layer between the second electrode and the organic light emitting layer, and an electron transport layer between the electron injection layer and the organic light emitting layer.

In exemplary embodiments, the OLED device may further include a contact electrically connected to the second electrode and the auxiliary electrode through the hole injection layer, the hole transport layer, the electron injection layer, and the electron transport layer.

In exemplary embodiments, the OLED device may further include an auxiliary wiring in direct contact with the conductive pattern. The auxiliary wiring may be disposed between the contact and the auxiliary electrode.

In exemplary embodiments, the second electrode may entirely cover the light emitting region and the transmission region.

In exemplary embodiments, the second electrode may selectively cover the light emitting region, so that the transmission region may be exposed.

According to exemplary embodiments, there is provided a method of manufacturing an OLED device. In the method, a substrate is provided to include a plurality of pixel areas. Each of the pixel areas may include a light emitting region and a transmission region. A first electrode on the light emitting region of the substrate and a conductive layer on the transmission region of the substrate may be simultaneously provided. An auxiliary electrode may be provided by forming a conductive pattern on the conductive layer. An organic light emitting layer may be disposed on the first electrode. A second electrode may be disposed on the organic light emitting layer. The second electrode may be electrically connected to the auxiliary electrode.

In exemplary embodiments, a hole transport layer may be defined before forming the organic light emitting layer. The hole transport layer may entirely cover the light emitting region and the transmission region. An electron transport layer may be provided after forming the organic light emitting layer. The electron transport layer may entirely cover the light emitting region and the transmission region. A contact may be provided through the hole transport layer and the electron transport layer before forming the second electrode.

In exemplary embodiments, forming the contact may include defining a contact hole through the hole transport layer and the electron transport layer by a laser drilling process.

The OLED device according to exemplary embodiments includes the second electrode that is electrically connected to the auxiliary electrode. The auxiliary electrode may include the conductive layer and the conductive pattern. The wires of the conductive pattern are spaced apart from each other in a predetermined distance so that an electrical resistance of the auxiliary electrode may be reduced and a degradation of a transmittance may be minimized. Therefore, the second electrode may have an improved electrical resistance.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Figure 1:
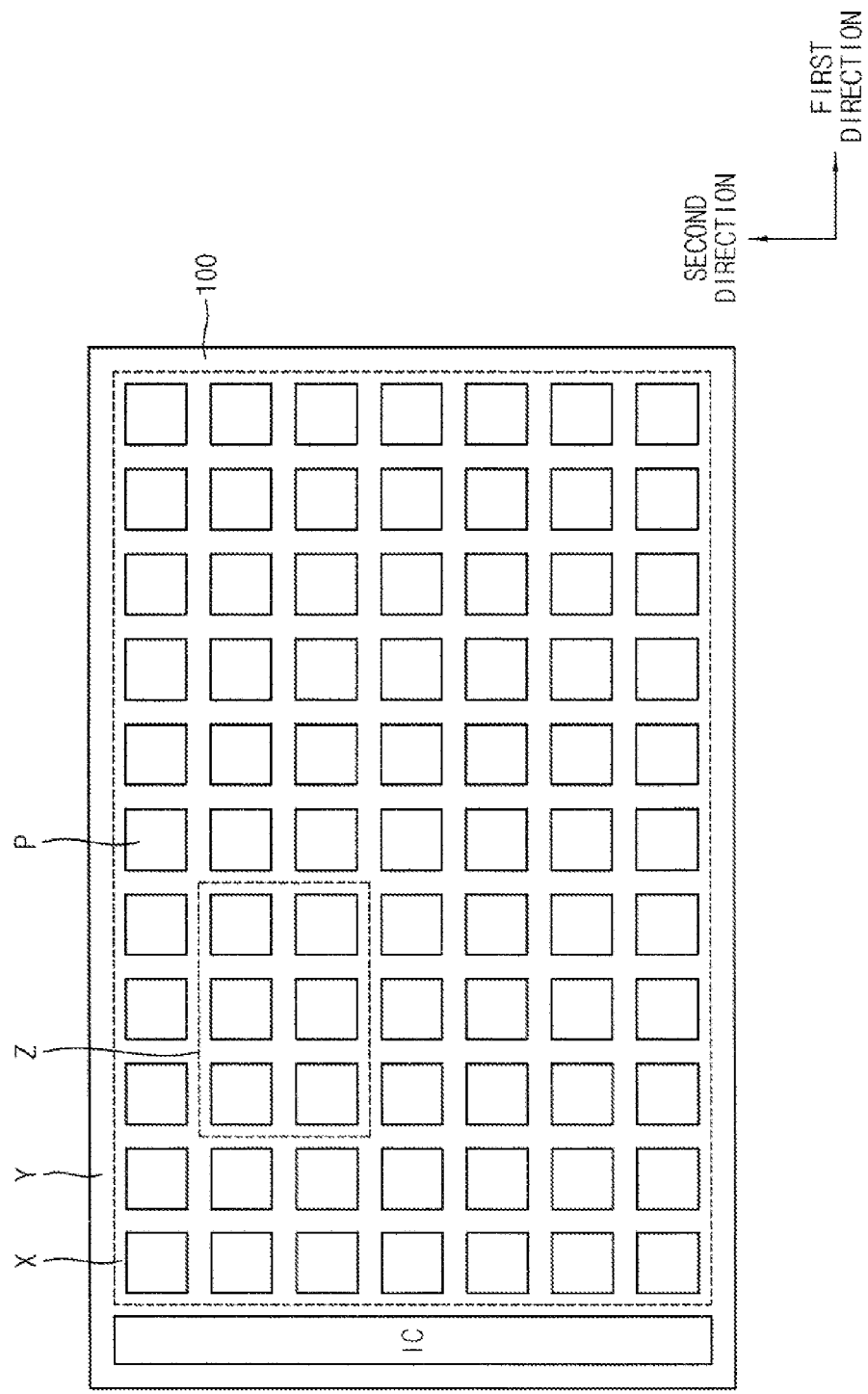
FIGS. 1 and 2 are top plan views illustrating exemplary embodiments of an organic light emitting display ("OLED") device in accordance with the invention.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this invention will be thorough and complete, and will fully convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of exemplary embodiments.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 2:
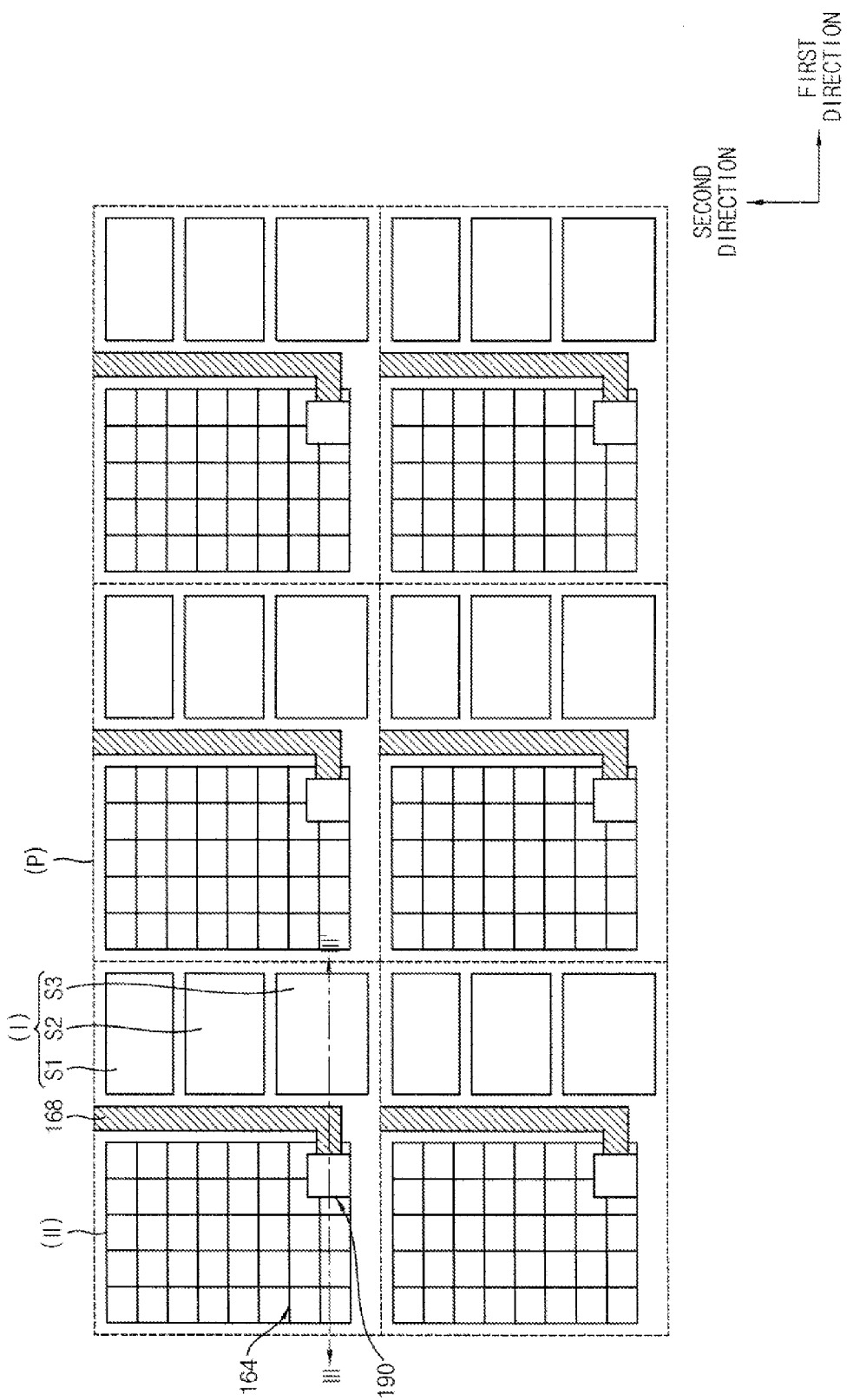

FIGS. 1 and 2 are top plan views illustrating an organic light emitting display ("OLED") device in accordance with exemplary embodiments. Specifically, FIG. 2 is an enlarged top plan view of region Z indicated by a dotted rectangle of FIG. 1.

Referring to FIG. 1, a first substrate 100 of the OLED device may be divided into a display area X and a peripheral area Y. The display area X may be an area in which an image is implemented on the OLED device. The peripheral area Y may be an area in which a driving integrated circuit ("IC") and wirings for driving the display area X may be placed.

In exemplary embodiments, the display area X may be located at a central portion of the first substrate 100, and the peripheral area Y may be located at an edge portion of the first substrate 100. In an exemplary embodiment, the peripheral area Y may surround at least one side of the display area X, for example. In an exemplary embodiment, the peripheral area Y may surround four sides of the display area X as illustrated in FIG. 1, for example. The peripheral area Y may be located at a right side, a left side, a top side and/or a bottom side of the display area X.

The driving circuit IC may include a data driving circuit, a scan driving circuit, a level shifter, and a buffer circuit. The driving circuit IC may be disposed in the peripheral area Y of the first substrate 100. The driving circuit IC may control electrical signals that may be transferred to pixel areas P. In exemplary embodiments, the driving circuit IC may be disposed at the left side or the right side of the display area X, and the driving circuit IC may extend in a second direction. The second direction is perpendicular to a first direction, and the first and second directions are parallel to a top surface of the first substrate 100.

Referring to FIGS. 1 and 2, a plurality of the pixel areas P may be arranged in the display area X of the first substrate 100.

In exemplary embodiments, the plurality of the pixel areas P may be arranged along the first and second directions on the first substrate 100.

Each of the pixel areas P may include a first area I and a second area II. A first light emitting region S1, a second light emitting region S2, and a third light emitting region S3 may be located in the first area I. In an exemplary embodiment, the first area I may be a light emitting area including the light emitting regions S1, S2, and S3, and the second area II may be a transmission area adjacent to the light emitting regions S1, S2 and S3, for example.

In exemplary embodiments, a red colored light, a green colored light, and a blue colored light may be generated from the first, second, and third light emitting regions S1, S2, and S3, respectively. In an exemplary embodiment, light emitting materials included in the first, second, and third light emitting regions S1, S2, and S3 may create the red colored light, the green colored light, the blue colored light, respectively, for example.

In exemplary embodiments, each of the first, second, and third light emitting regions S1, S2, and S3 may have a polygonal shape extending in the first direction, for example. The third light emitting region S3 may have an area greater than that of each of the first light emitting region S1 and the second light emitting region S2. In exemplary embodiments, the third light emitting region S3 may have an area which may be substantially equal to that of the each of the first light emitting region S1 and the second light emitting region S2.

The second area II may be spaced apart from the first area I in the first direction. In an exemplary embodiment, an area ratio of the second area II based on a total area of the pixel area P may range from about 20% to about 90%, for example.

Figure 3:
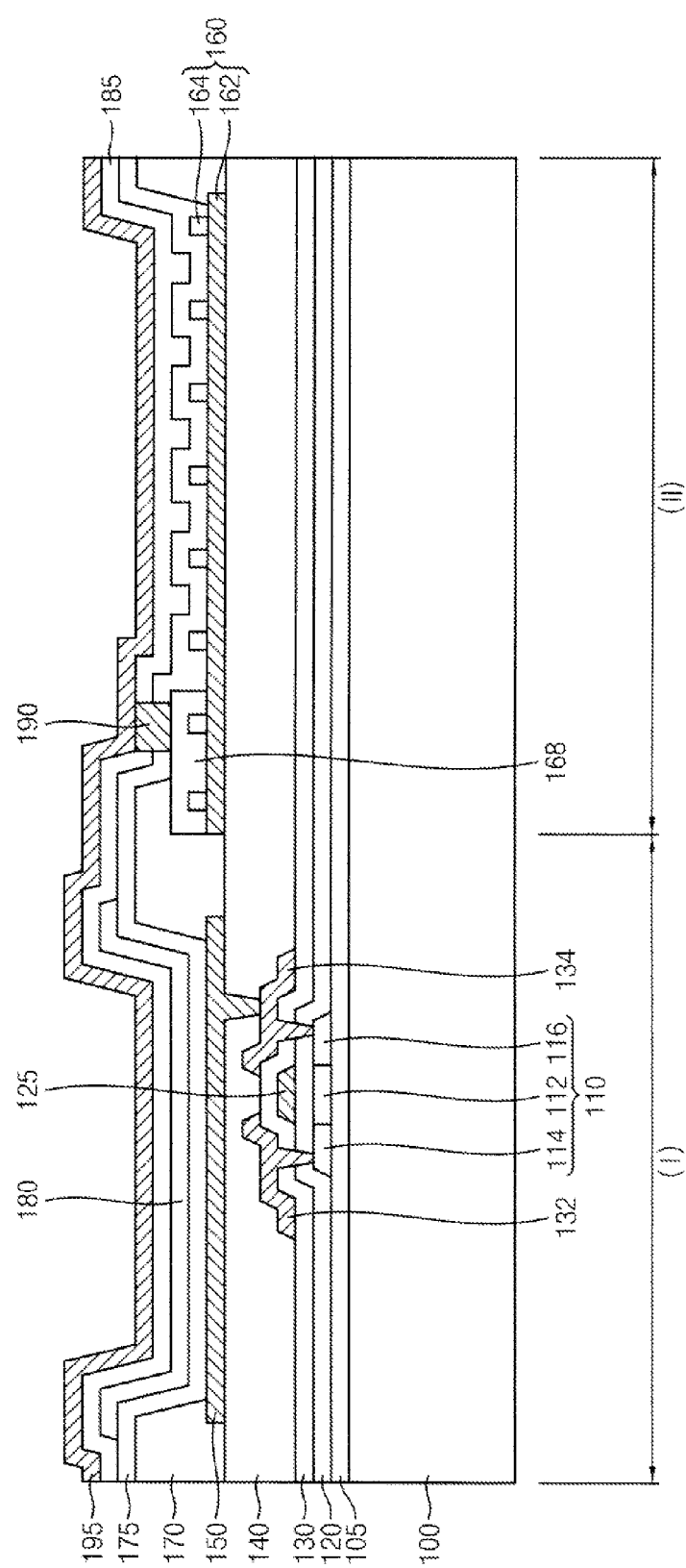
FIG. 3 is a cross-sectional view illustrating exemplary embodiments of an OLED device in accordance with the invention.

FIG. 3 is a cross-sectional view taken along line III-III' of FIG. 2.

Referring to FIGS. 2 and 3, the OLED device may include the first substrate 100, a switching device, a first electrode 150, an auxiliary electrode 160, a light emitting structure, and a second electrode 195.

In an exemplary embodiment, the first substrate 100 may include a transparent insulation substrate. In an exemplary embodiment, the first substrate 100 may include a glass substrate, a quartz substrate, a transparent resin substrate, or the like, for example. In exemplary embodiments, the first substrate 100 may include a flexible substrate.

A buffer layer 105 may be defined on the first substrate 100. The buffer layer 105 may substantially serve as a planarization layer and may prevent impurities from being diffused into the first substrate 100. The buffer layer 105 may include an inorganic material, an organic material, or a combination thereof. In an exemplary embodiment, the inorganic material may include at least one of silicon oxide, silicon nitride, silicon oxy nitride, aluminum oxide, aluminum nitride, titanium oxide and titanium nitride, and the organic material may include at least one of a polyimide-based resin, a polyester-based resin and an acryl-based resin, for example. The above-described elements may be used alone or in a combination thereof. In other exemplary embodiments, the buffer layer 105 may be omitted.

The switching device may be disposed on the buffer layer 105. In exemplary embodiments, a circuit structure may be defined by the switching device and a capacitor (not illustrated), for example. The circuit structure may be disposed on each of the first to third light emitting regions S1, S2 and S3.

In an exemplary embodiment, the switching device may include a transistor, and the transistor may include an active pattern 110, a gate insulation layer 120, a gate electrode 125, a source electrode 132, and a drain electrode 134, for example.

The active pattern 110 may include at least one of an oxide semiconductor, polysilicon, doped polysilicon, amorphous silicon and doped amorphous silicon, or the like, for example. In exemplary embodiments, the oxide semiconductor may include at least one of a binary combination (ABx), a ternary combination (ABxCy) and a quaternary combination (ABxCyOz) which may include at least one of indium (In), zinc (Zn), gallium (Ga), tin (Sn), titanium (Ti), aluminum (Al), hafnium (Hf), zirconium (Zr) and magnesium (Mg), etc, for example. The above-described elements may be used alone or in a combination thereof. In an exemplary embodiment, the oxide semiconductor may include a material represented as, e.g., G-I-Z-O ([(In$_2$O$_3$)$_a$ (Ga$_2$O$_3$)$_b$(ZnO)$_c$I], a, b, and c are each a real number satisfying a≥0, b≥0, c>0). In an exemplary embodiment, when the active pattern 110 includes the oxide semiconductor, a transmittance with respect to an external light at the light emitting regions S1, S2, and S3 may be improved.

The active pattern 110 may include a channel region 112, a source region 114, and a drain region 116. The source region 114 and the drain region 116 may be doped with impurities, and the channel region 112 may be interposed between the source region 114 and the drain region 116.

A gate insulation layer 120 may be disposed on the buffer layer 105 and cover the active pattern 110. The gate electrode 125 may be disposed on the gate insulation layer 120. In exemplary embodiments, the gate electrode 125 may substantially overlap the channel region 112 of the active pattern 110.

A first insulating interlayer 130 may be disposed on the gate insulation layer 120 and cover the gate electrode 125. A source electrode 132 and a drain electrode 134 may be electrically connected to the source region 114 and the drain region 116, respectively, through holes defined in the first insulating interlayer 130 and the gate insulation layer 120.

The transistor illustrated in FIG. 3 may have a top gate structure in which the gate electrode 125 is disposed over the active pattern 110. However, the invention is not limited thereto, and the transistor may have a bottom gate structure in which the gate electrode 125 is disposed under the active pattern 110.

A via insulation layer 140 may be disposed on the first insulating interlayer 130 and cover the switching device. In exemplary embodiments, the via insulation layer 140 may have a substantially leveled top surface, for example.

The first electrode 150 may be disposed on the via insulation layer 140. The first electrode 150 may be disposed on the each of the first to third light emitting regions S1, S2, and S3 in the first area I. The first electrode 150 may be electrically connected to the switching device through a hole defined in the via insulation layer 140.

In exemplary embodiments, the first electrode 150 may include a transparent conductive material. In an exemplary embodiment, the first electrode 150 may include at least one of indium tin oxide ("ITO"), indium zinc oxide ("IZO"), zinc oxide (ZnOx), magnesium oxide (MgOx), titanium oxide (TiOx), graphene, a carbon nanotube ("CNT") and a conductive polymer such as poly(3,4-ethylenedioxyehiophene) polystyrene sulfonate (PEDOT:PSS), for example. The above-described elements may be used alone or in a combination thereof.

The auxiliary electrode 160 may be disposed on the via insulation layer 140 in the second area II.

Figure 4:
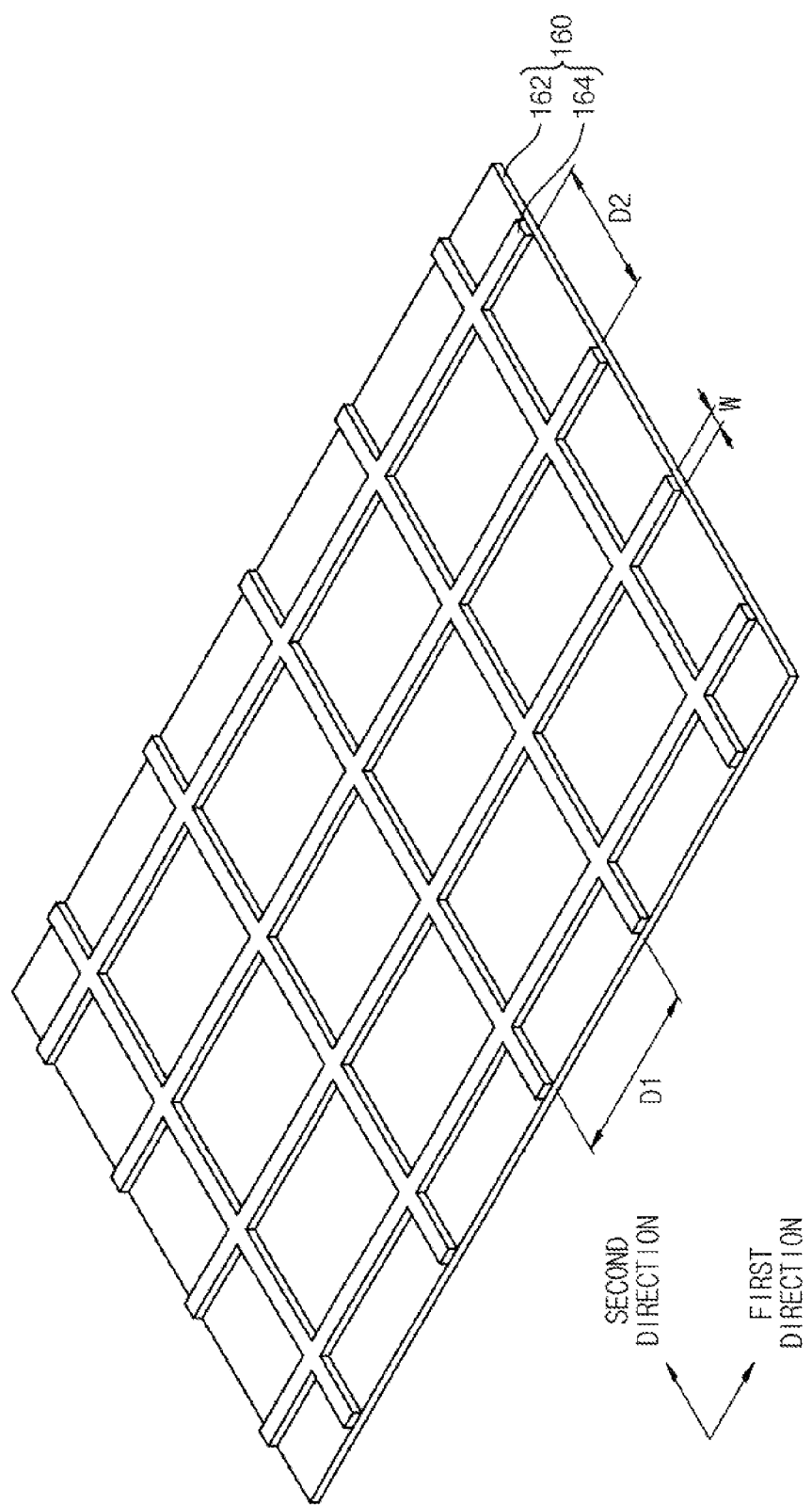
FIG. 4 is a perspective view illustrating exemplary embodiments of an auxiliary electrode of an OLED device in accordance with the invention.

Referring to FIGS. 3 and 4, the auxiliary electrode 160 may include a conductive layer 162 and a conductive pattern 164.

The conductive layer 162 may be disposed on the second area II. The conductive layer 162 may be spaced apart from the first electrode 150 disposed on the first area I. In an exemplary embodiment, the conductive layer 162 may not be in direct contact with the first electrode 150, for example.

The conductive layer 162 and the first electrode 150 may include substantially the same material. The conductive layer 162 and the first electrode 150 may have substantially the same thickness. In an exemplary embodiment, the conductive layer 162 and the first electrode 150 may be simultaneously provided through the same process, for example. The conductive layer 162 may include the transparent conductive material as mentioned above, so that a transmittance on the second area II may not be reduced by the conductive layer 162.

The conductive pattern 164 may be disposed on the conductive layer 162 and disposed on the second area II. A bottom surface of the conductive pattern 164 and a top surface of the conductive layer 162 may be in direct contact with and/or electrically connected to each other. An electrical resistance of the auxiliary electrode 160 may be reduced by the conductive pattern 164.

In exemplary embodiments, the conductive pattern 164 may have a grid arrangement including, e.g., wires that may extend in the first and second directions and may cross each other. The wires may be spaced apart from each other by the predetermined distance.

Each of the wires of the conductive pattern 164 may have a first width W. The wires may be arranged in the first direction and spaced apart from each other by a first distance D1 along the first direction, and may be also arranged in the second direction and spaced apart from each other by a second distance D2 along the second direction. The first and second distances D1 and D2 may be substantially the same as or different from each other.

The first width W, the first distance D1, and the second distance D2 may be determined in consideration of the electrical resistance and a transmittance of the auxiliary electrode 160. In an exemplary embodiment, the electrical resistance and the transmittance may be reduced, as the first width W becomes increased and as the first and second distances D1 and D2 become decreased, for example. However, the electrical resistance and the transmittance may be increased, as the first width W becomes decreased and as the first and second distances D1 and D2 become increased.

The conductive pattern 164 may include a material having a resistivity not greater than that of the conductive layer 162. In an exemplary embodiment, the conductive pattern 164 may include at least one of the conductive polymer material such as PEDOT:PSS, a metal such as a metal nanowire, silver (Ag), or gold (Au), graphene, and a CNT, or the like, for example. The above-described elements may be used alone or in a combination thereof. In exemplary embodiments, the conductive pattern 164 may have the grid arrangement, so that a degradation of the transmittance on the second area II due to the conductive pattern 164 may be minimized.

When the first and second distances D1 and D2 are substantially the same, the electrical resistance of the auxiliary electrode 160 may be calculated by, e.g., Equations 1 to 3 below.

$$\frac{1}{R_{electrode}} = \frac{1}{R_{plate}} + \frac{1}{R_{pattern}} \qquad \text{[Equation 1]}$$

(Here, the value $R_{electrode}$ is the electrical resistance of the auxiliary electrode 160, the value $R_{plate}$ is an electrical resistance of the conductive layer 162, and the value $R_{pattern}$ is an electrical resistance of the conductive pattern 164.)

$$R_{pattern} = R_{sheet,pattern} \times \left( \frac{1 - \sqrt{A} + A}{1 - \sqrt{A}} \right) \qquad \text{[Equation 2]}$$

(Here, the value $R_{sheet, pattern}$ is a sheet resistance of the conductive pattern 164 and is determined by component materials and a thickness of the conductive pattern 164. The value A is determined by Equation 3.)

$$A = \left(\frac{D1}{W + D1}\right)^2 \qquad \text{[Equation 3]}$$

(Here, the value W is a width of each wire of the conductive pattern 164, and the value D1 is a distance between neighboring wires of the conductive pattern 164 along the first direction.)

As illustrated in FIGS. 2 and 3, an auxiliary wiring 168 may be disposed on the auxiliary electrode 160. In exemplary embodiments, the auxiliary wiring 168 may partially cover the auxiliary electrode 160.

The auxiliary wiring 168 may be in direct contact with the conductive pattern 164 of the conductive electrode 160. A contact resistance between the auxiliary electrode 160 and a contact 190 may be reduced by the auxiliary wiring 168. An area for a formation of the contact 190 may be extended by the auxiliary wiring 168, and thus a degree of freedom may be improved from an aspect of a circuit design, for example.

A pixel defining layer 170 may be disposed on the via insulation layer 140 and partially cover the first electrode 150, the auxiliary electrode 160, and the auxiliary wiring 168. In exemplary embodiments, the pixel defining layer 170 may include an organic insulation material or an inorganic insulation material such as silicon oxide or silicon nitride.

The light emitting structure may be disposed on the first electrode 150, the auxiliary electrode 160, the auxiliary wiring 168, and the pixel defining layer 170. In exemplary embodiments, the light emitting structure may include a hole transport layer ("HTL") 175, an organic light emitting layer 180, and an electron transport layer ("ETL") 185. The light emitting structure may further include a hole injection layer ("HIL") under the HTL 175 and an electron injection layer ("EIL") on the ETL 185.

The HTL 175 and the ETL 185 may be provided commonly and continuously on the first and second areas I and II, and the organic light emitting layer may be disposed selectively on the each of the first to third light emitting regions S1, S2, and S3 (refer to FIG. 2) on the first area I.

The contact 190 may be electrically connected to the auxiliary wiring 168 through the light emitting structure. In exemplary embodiments, the contact 190 may be adjacent to the pixel defining layer 170, however, may not overlap the pixel defining layer 170. In an exemplary embodiment, in a formation of the contact 190, a contact hole may be defined through the light emitting structure, but may not be defined through the pixel defining layer 170.

The second electrode 195 may be disposed on the light emitting structure and the contact 190. The second electrode 195 may be electrically connected to the auxiliary electrode 160 via the contact 190. In exemplary embodiments, the second electrode 195 may extend commonly and continuously on the first and second areas I and II.

In an exemplary embodiment, the second electrode 195 may include a metal. In an exemplary embodiment, the second electrode 195 may include at least one of aluminum (Al), platinum (Pt), silver (Ag), magnesium (Mg), gold (Au), Chrome (Cr), tungsten (W), molybdenum (Mo), titanium (Ti) and an alloy thereof, for example. In exemplary embodiments, the second electrode 195 may include at least one of Al, Ag and an alloy of magnesium and silver having a low electrical resistance and an improved transmittance, for example. A thickness of the second electrode 195 may be determined in consideration of the electrical resistance and the transmittance of the second electrode 195. The electrical resistance of the second electrode 195 may be increased and the transmittance of the second electrode 195 may be improved as the thickness of the second electrode 195 becomes decreased.

In exemplary embodiments, the second electrode 195 is electrically connected to the auxiliary electrode 160, so that the electrical resistance of the second electrode 195 may be further reduced. Therefore, the second electrode 195 may be designed to have a substantially thin thickness, and the transmittance of the second electrode 195 may be further improved. In an exemplary embodiment, the thickness of the second electrode 195 may range from about 10 angstrom ("Å") to about 100 Å.

Figure 5:
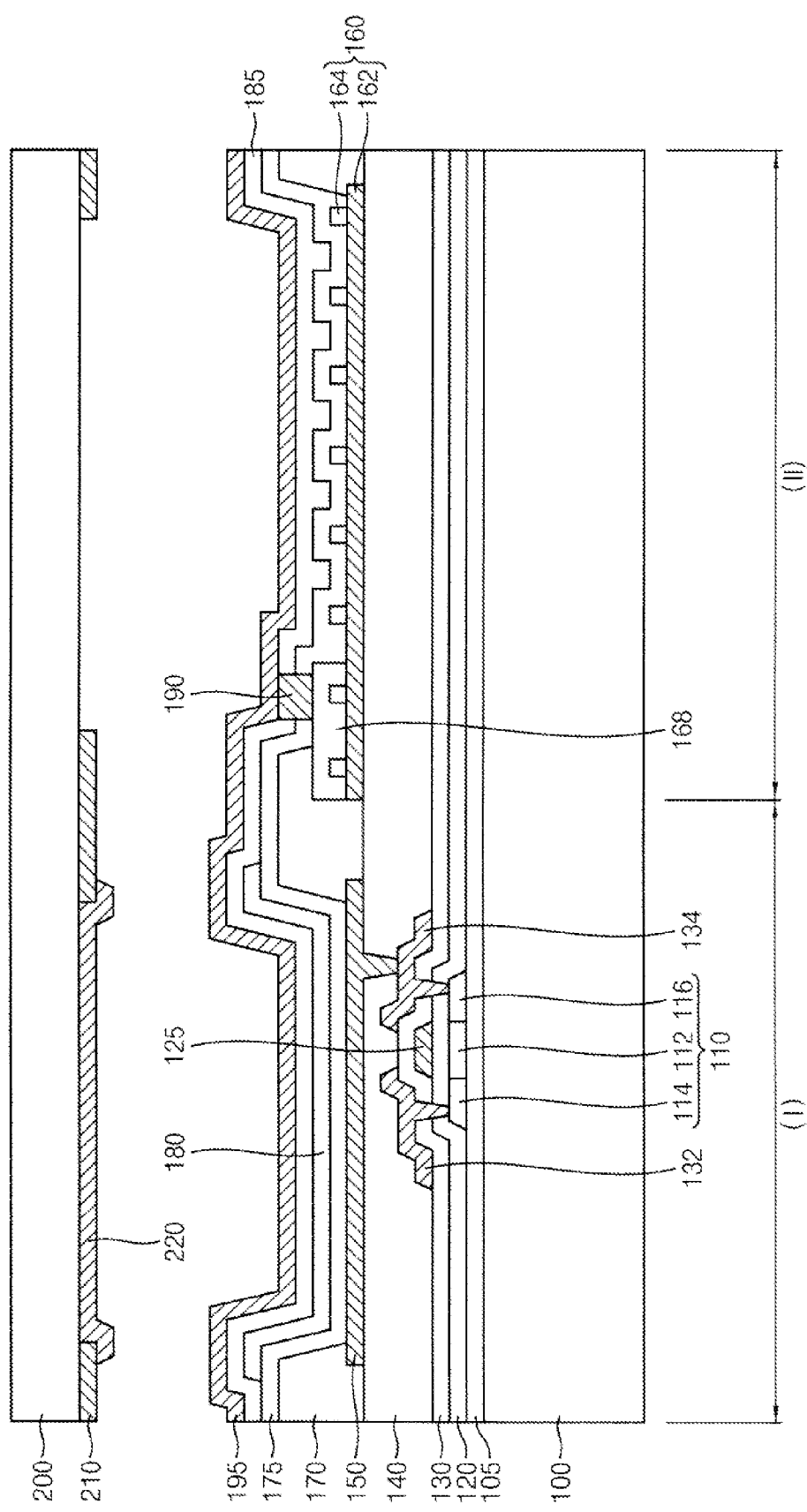
FIG. 5 is a cross-sectional view illustrating exemplary embodiments of an OLED device in accordance with the invention.

FIG. 5 is a cross-sectional view illustrating an OLED device in accordance with exemplary embodiments.

The OLED device may include a first substrate 100, a switching device, a first electrode 150, an auxiliary electrode 160, a light emitting structure and a second electrode 195 as illustrated with reference to FIGS. 2 to 4.

The OLED device may further include a second substrate 200, a light blocking pattern 210, and a color filter 220. The second substrate 200 may face the first substrate 100 with respect to the light emitting structure and the second electrode 195. The light blocking pattern 210 and the color filter 220 may be disposed on the second substrate 200.

The second substrate 200 may include substantially the same material as that of the first substrate 100.

The light blocking pattern 210 may be disposed on an opposing surface of the second substrate 200 with respect to the first substrate 100. The light blocking pattern 210 may be located so that each of light emitting regions S1, S2, and S3 on a first area I and a transmission region on a second area II may be exposed therethrough.

The color filter 220 may correspond to the each of the light emitting regions S1, S2, and S3 on the first area I. A light emitted from an organic light emitting layer 180 may pass through the color filter 220 to have a particular wavelength. In an exemplary embodiment, the color filter 220 may also serve as an anti-reflective layer for external light, for example. The color filter 220 may not cover the second area II, so that a transmittance of the second area II may be improved.

FIGS. 6 to 13 are cross-sectional views illustrating a method of manufacturing an OLED device in accordance with exemplary embodiments.

Figure 6:
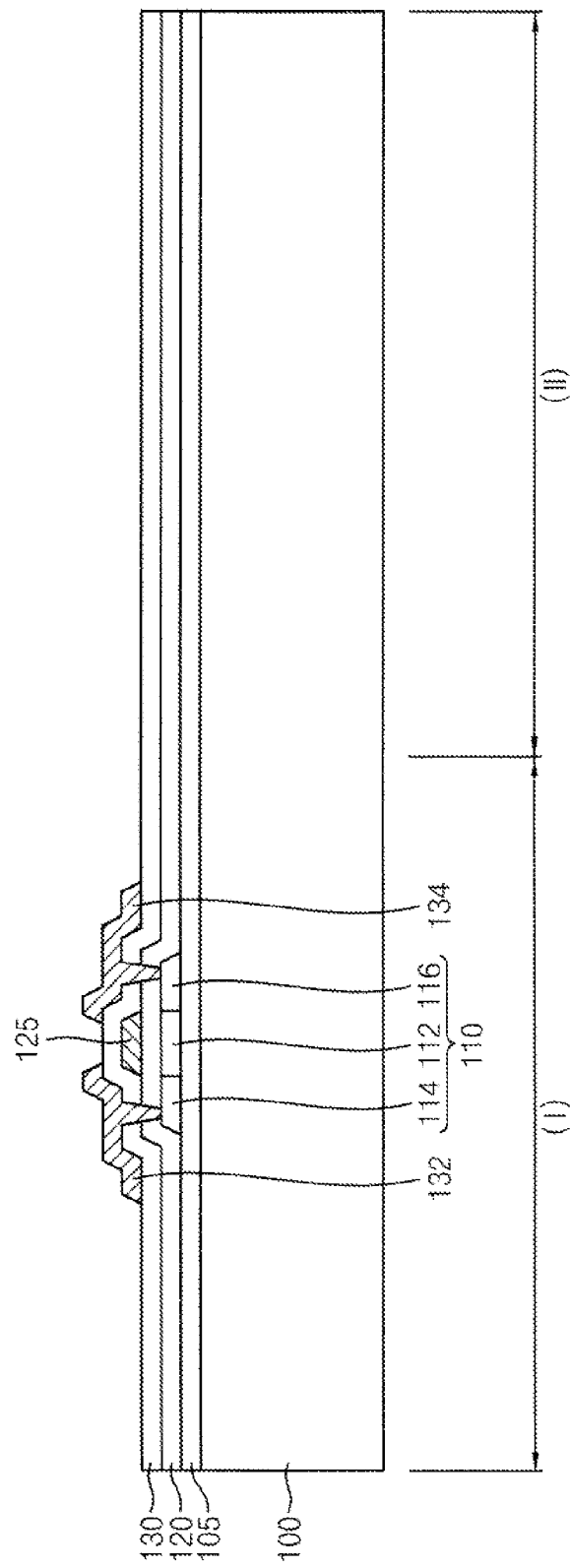
FIGS. 6 to 13 are cross-sectional views illustrating exemplary embodiments of a method of manufacturing an OLED device in accordance with the invention.

Referring to FIG. 6, a switching device may be disposed on a first substrate 100.

As illustrated in FIG. 2, the first substrate 100 may include a plurality of pixel areas. Each of the pixel areas may be divided into a first area I and a second area II. The first area I may include a light emitting region, and the second area II may include a transmission region.

A buffer layer 105 may be disposed on the first substrate 100. In exemplary embodiments, the buffer layer 105 may be provided by a deposition process or a coating process using an inorganic material, an organic material or a combination thereof, for example. In an exemplary embodiment, the inorganic material may include at least one of silicon oxide, silicon nitride, silicon oxy nitride, aluminum oxide, aluminum nitride, titanium oxide and titanium nitride, and the organic material may include at least one of a polyimide-based resin, a polyester-based resin and an acryl-based resin, for example. The above-described elements may be used alone or in a combination thereof. In exemplary embodiments, the buffer layer 105 may be omitted.

A semiconductor layer may be disposed on the buffer layer 105 using an oxide semiconductor, polysilicon, amorphous silicon, or the like, and then the semiconductor layer may be partially etched to form an active pattern 110. In an exemplary embodiment, the semiconductor layer may include the oxide semiconductor by a sputtering process using a plurality of targets, for example.

A gate insulation layer 120 covering the active pattern 110 may be disposed on the buffer layer 105. A gate electrode 125 may be disposed on the gate insulation layer 120 and partially overlap the active pattern 110.

Impurities may be implanted into portions of the active pattern 110 by using the gate electrode 125 as an ion implantation mask, so that a source region 114 and a drain region 116 may be provided.

A first insulating interlayer 130 covering the gate electrode 125 may be disposed on the gate insulation layer 120. A source electrode 132 and a drain electrode 134 may be provided through the first insulating interlayer 130 and the gate insulation layer 120, so that the source electrode 132 and the drain electrode 134 may be electrically connected to the source region 114 and the drain region 116, respectively.

Figure 7:
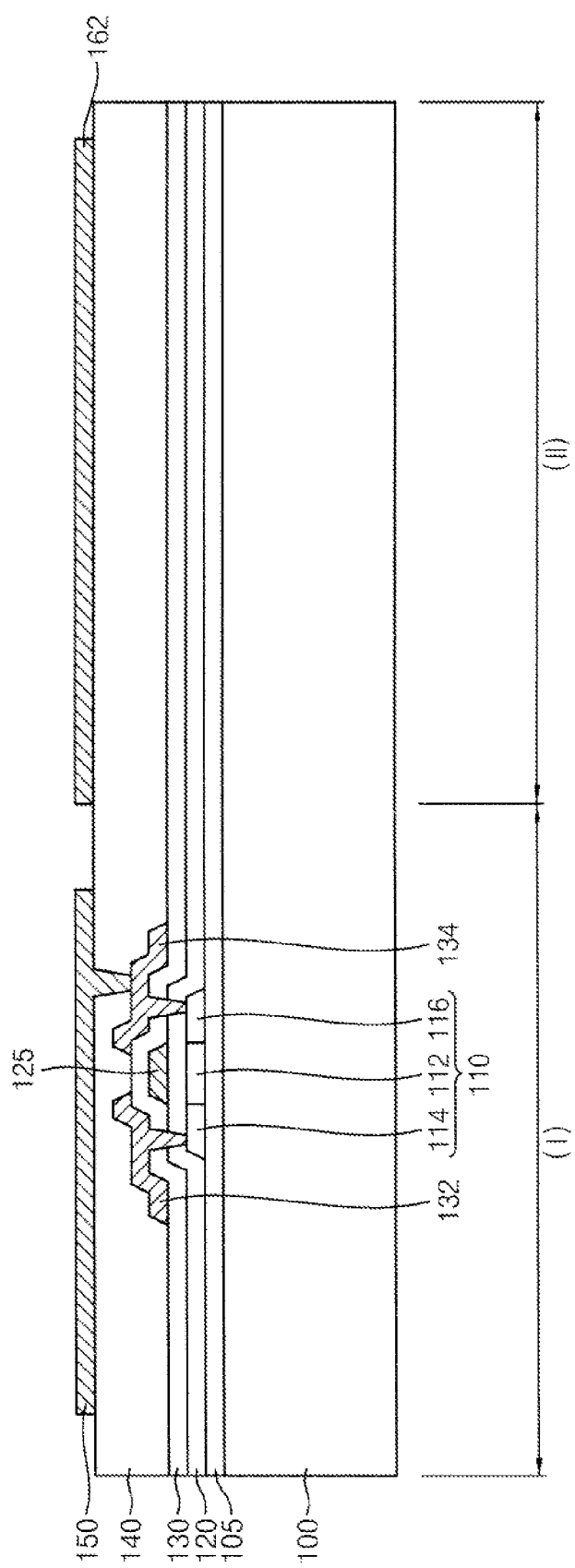

Referring to FIG. 7, a via insulation layer 140 may be disposed on the first insulating interlayer 130, and a first electrode 150 and a conductive layer 162 may be disposed on the via insulation layer 140.

The via insulation layer 140 may cover the source electrode 132 and the drain electrode 134.

The via insulation layer 140 may be partially removed to define a contact hole exposing the drain electrode 134. A first electrode layer may be provided to fill the contact hole on the via insulation layer 140, and then the first electrode layer may be partially removed to form the first electrode 150 and the conductive layer 162.

The first electrode 150 and the conductive layer 162 may include substantially the same material and may extend on substantially the same plane.

In exemplary embodiments, the first electrode layer may include at least one of ITO, IZO, zinc oxide (ZnOx), magnesium oxide (MgOx), titanium oxide (TiOx), graphene, a CNT and a conductive polymer material such as PEDOT:PSS, for example. The above-described elements may be used alone or in a combination thereof.

In exemplary embodiments, when the first electrode layer includes ITO, IZO, zinc oxide (ZnOx), magnesium oxide (MgOx), or titanium oxide (TiOx), the first electrode layer may be provided by a relatively high temperature deposition process such as a physical vapor deposition ("PVD") or a chemical vapor deposition ("CVD").

In exemplary embodiments, when the first electrode layer includes graphene, the CNT or PEDOT:PSS, the first electrode layer may be provided by a relatively low temperature process such as a coating process.

Figure 8:
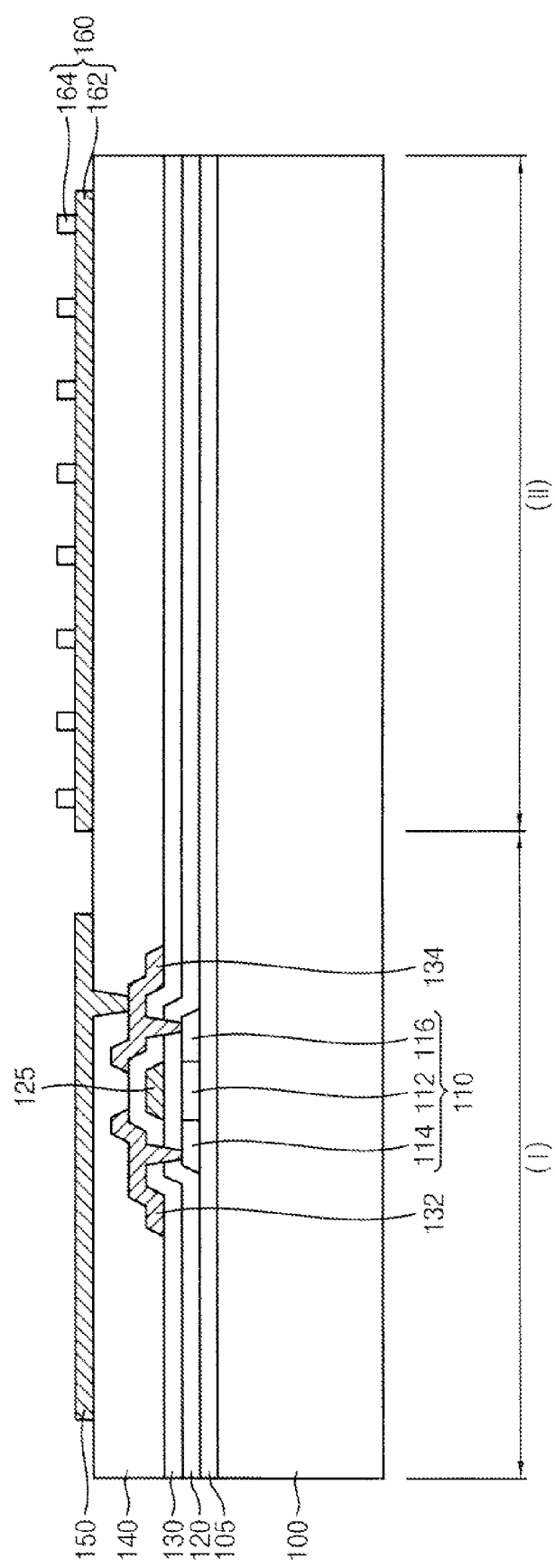

Referring to FIG. 8, a conductive pattern 164 may be defined on the conductive layer 162.

A layer may be disposed on the conductive layer 162, the first electrode 150, and the via insulation layer 140, and then the layer may be partially removed to form the conductive pattern 164.

In exemplary embodiments, the layer may include a material having a resistivity not greater than that of the conductive layer 162. The conductive pattern 164 may include at least one of the conductive polymer material such as PEDOT:PSS, a metal such as a metal nanowire, silver (Ag), or gold (Au), graphene and the CNT, or the like, for example. The above-described elements may be used alone or in a combination thereof.

In exemplary embodiments, when the conductive pattern 164 includes the metal nanowire, silver (Ag), or gold (Au), the layer may be provided by the relatively high temperature deposition process such as the PVD or the CVD.

In exemplary embodiments, when the conductive pattern 164 includes graphene, the CNT or the conductive polymer material such as PEDOT:PSS, the layer may be provided by the relatively low temperature process such as the coating process.

In exemplary embodiments, when the conductive pattern 164 includes the conductive polymer material such as PEDOT:PSS, a block copolymer may be used to form the layer. The block copolymer may be partially removed using an etching solution to form the conductive pattern without using an optical patterning process.

Therefore, an auxiliary electrode 160 may be defined by the conductive layer 162 and the conductive pattern 164.

Figure 9:
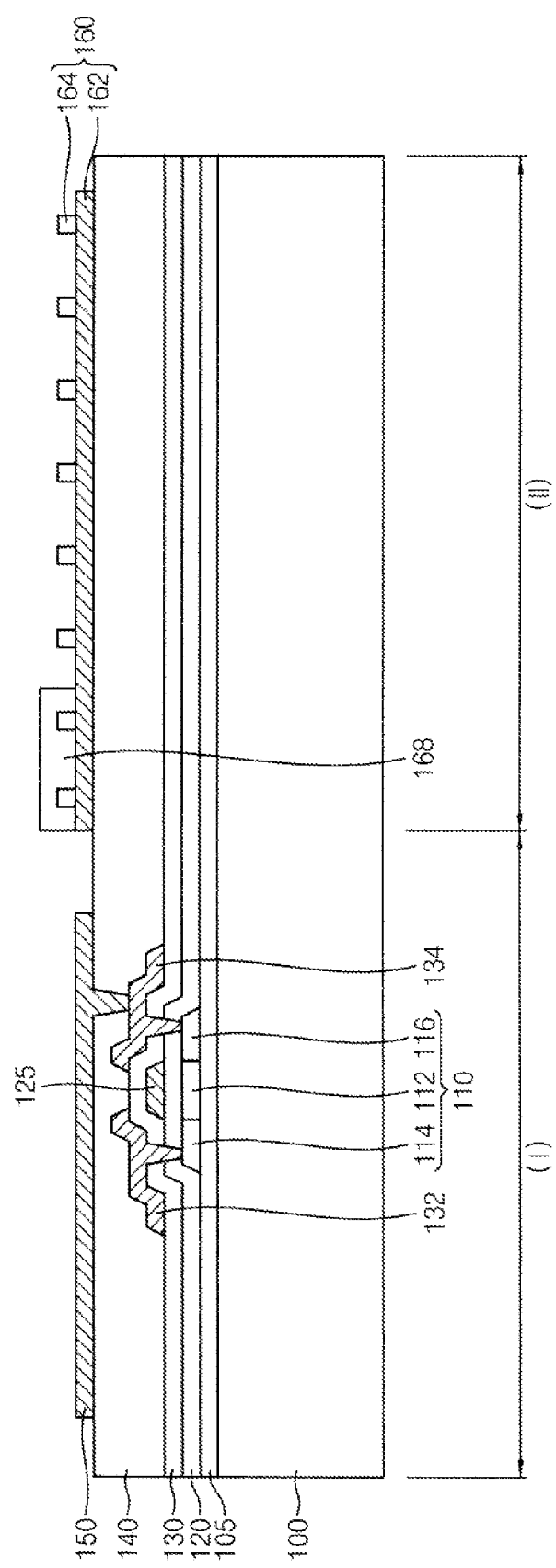

Referring to FIG. 9, an auxiliary wiring 168 may be disposed on the auxiliary electrode 160.

A wiring layer may be disposed on the via insulation layer 140, the first electrode 150, and the auxiliary electrode 160, and then the wiring layer may be partially removed to form the auxiliary wiring 168.

The auxiliary wiring 168 may partially cover the auxiliary electrode 160, and may be in direct contact with the conductive pattern 164 having a low resistivity. A contact resistance between the auxiliary electrode 160 and a contact 190 may be reduced by the auxiliary wiring 168. An area for a formation of the contact 190 may be extended by the auxiliary wiring 168, and thus a degree of freedom may be improved from an aspect of, e.g., a circuit design.

Figure 10:
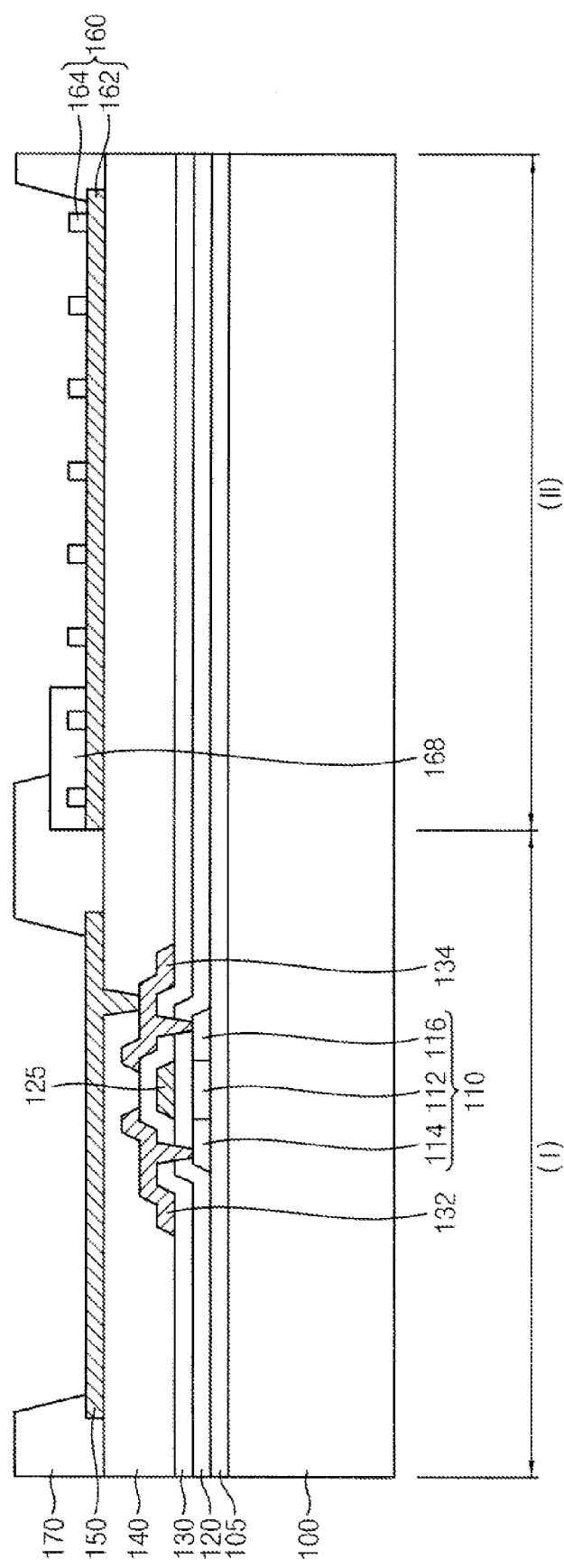

Referring to FIG. 10, a pixel defining layer 170 partially covering the first electrode 150, the auxiliary electrode 160, and the auxiliary wiring 168 may be disposed on the via insulation layer 140.

The pixel defining layer 170 may be provided using the organic material. By forming the pixel defining layer 170, the light emitting regions S1, S2, and S3 may be defined on the first area I, and the transmission region may be defined on the second area II. The pixel defining layer 170 may not cover the light emitting region and the transmission region.

Figure 11:
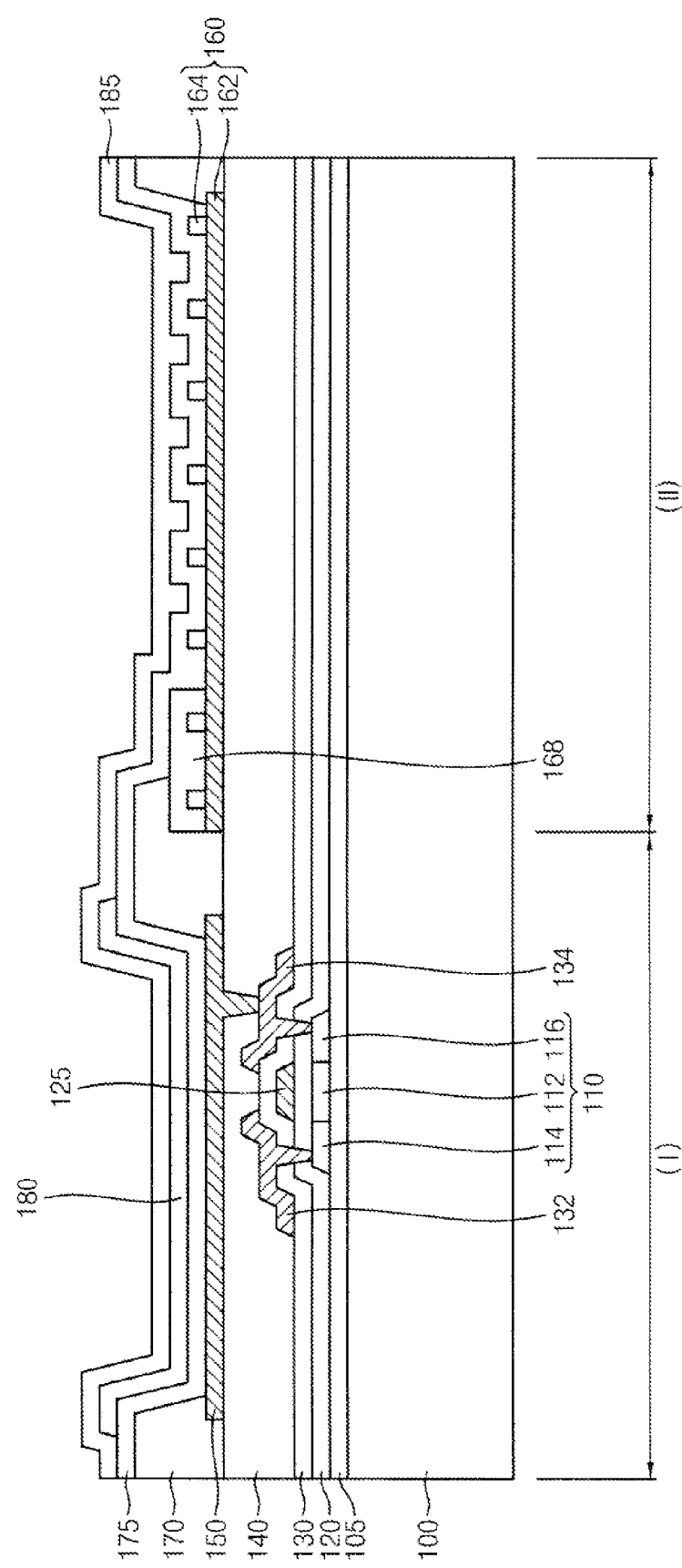

Referring to FIG. 11, a light emitting structure may be disposed on the first electrode 150, the auxiliary electrode 160, and the pixel defining layer 170.

A process forming the light emitting structure may include a process forming a hole injection layer, a hole transport layer 175, an organic light emitting layer 180, an electron transport layer 185, and an electron injection layer.

The hole injection layer, the hole transport layer 175, the electron transport layer 185, and the electron injection layer may be disposed commonly and continuously on the first and second areas I and II, and an extra patterning process may not be performed.

However, the organic light emitting layer 180 may be disposed selectively on each of the light emitting regions S1, S2, and S3.

Figure 12:
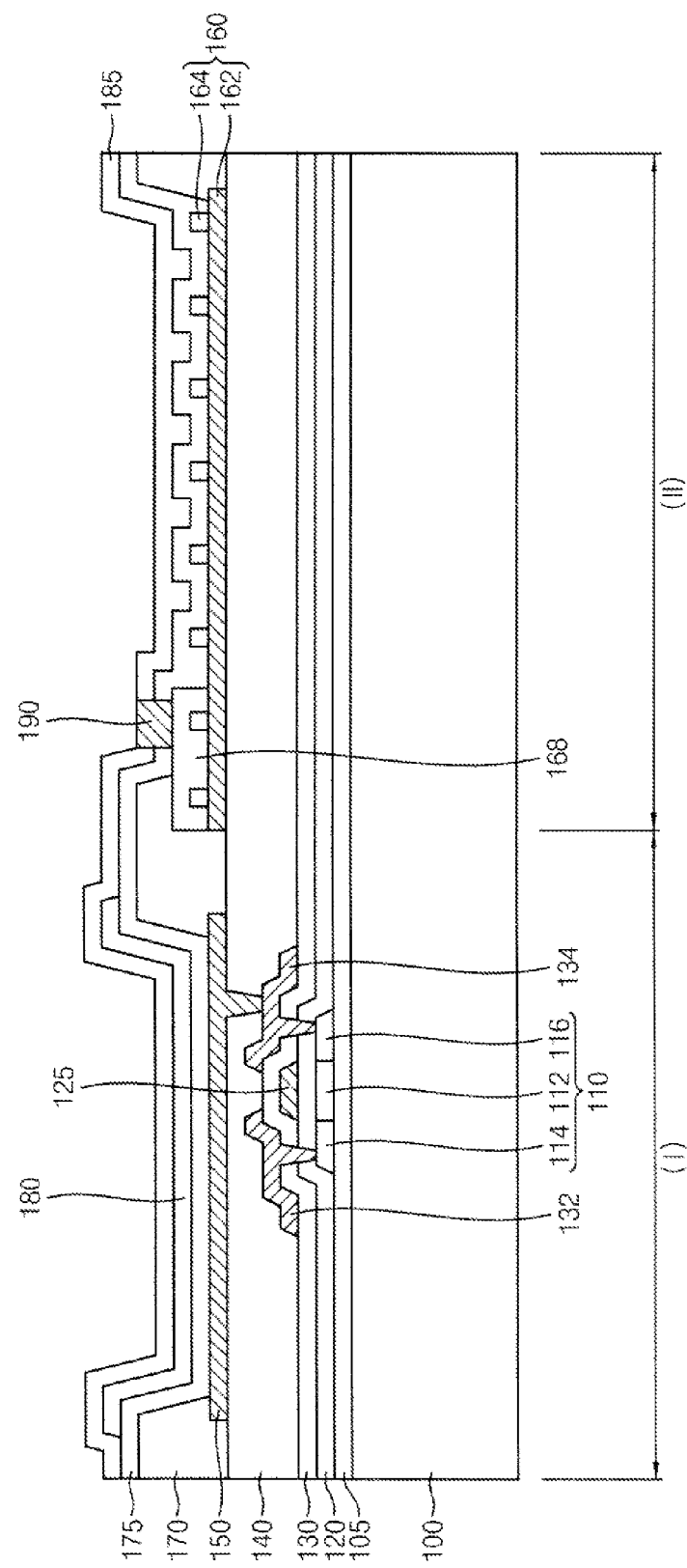

Referring to FIG. 12, the contact 190 may be provided through the light emitting structure.

In exemplary embodiments, the contact 190 may be provided by a laser drilling process. In an exemplary embodiment, a laser beam may be used to partially remove an organic layer of the light emitting structure to define a contact hole, and then the contact 190 may be provided to fill the contact hole.

In exemplary embodiments, the contact 190 may be adjacent to the pixel defining layer 170, however, may not overlap the pixel defining layer 170. In an exemplary embodiment, in a formation of the contact hole, the pixel defining layer 170 may not be removed, for example.

Figure 13:
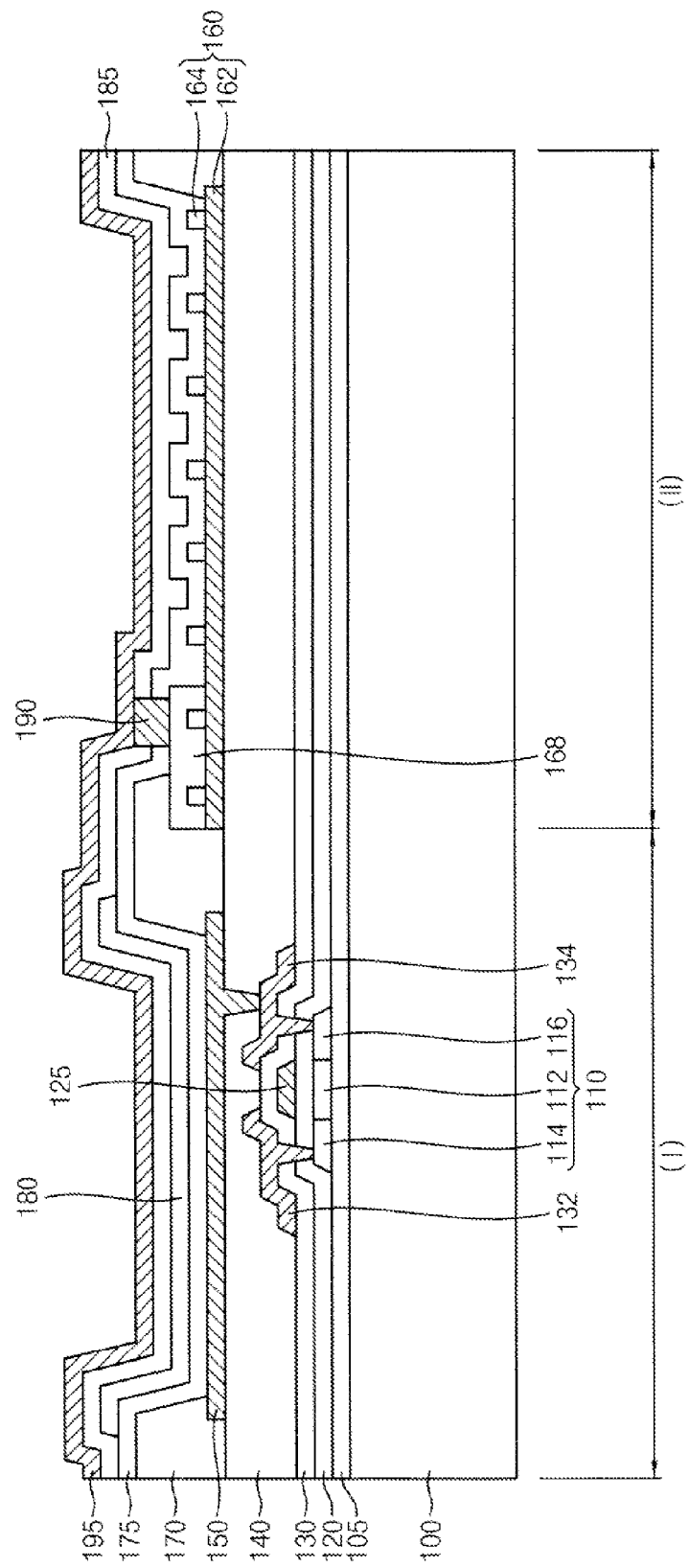

Referring to FIG. 13, a second electrode 195 may be disposed on the light emitting structure and the contact 190.

In exemplary embodiments, the second electrode 195 may include at least one of aluminum (Al), platinum (Pt), silver (Ag), magnesium (Mg), gold (Au), Chrome (Cr), tungsten (W), molybdenum (Mo), titanium (Ti) and an alloy thereof.

The second electrode 195 may be electrically connected to the auxiliary electrode 160 through the contact 190, so that an electrical resistance of the second electrode 195 may be reduced.

Figure 14:
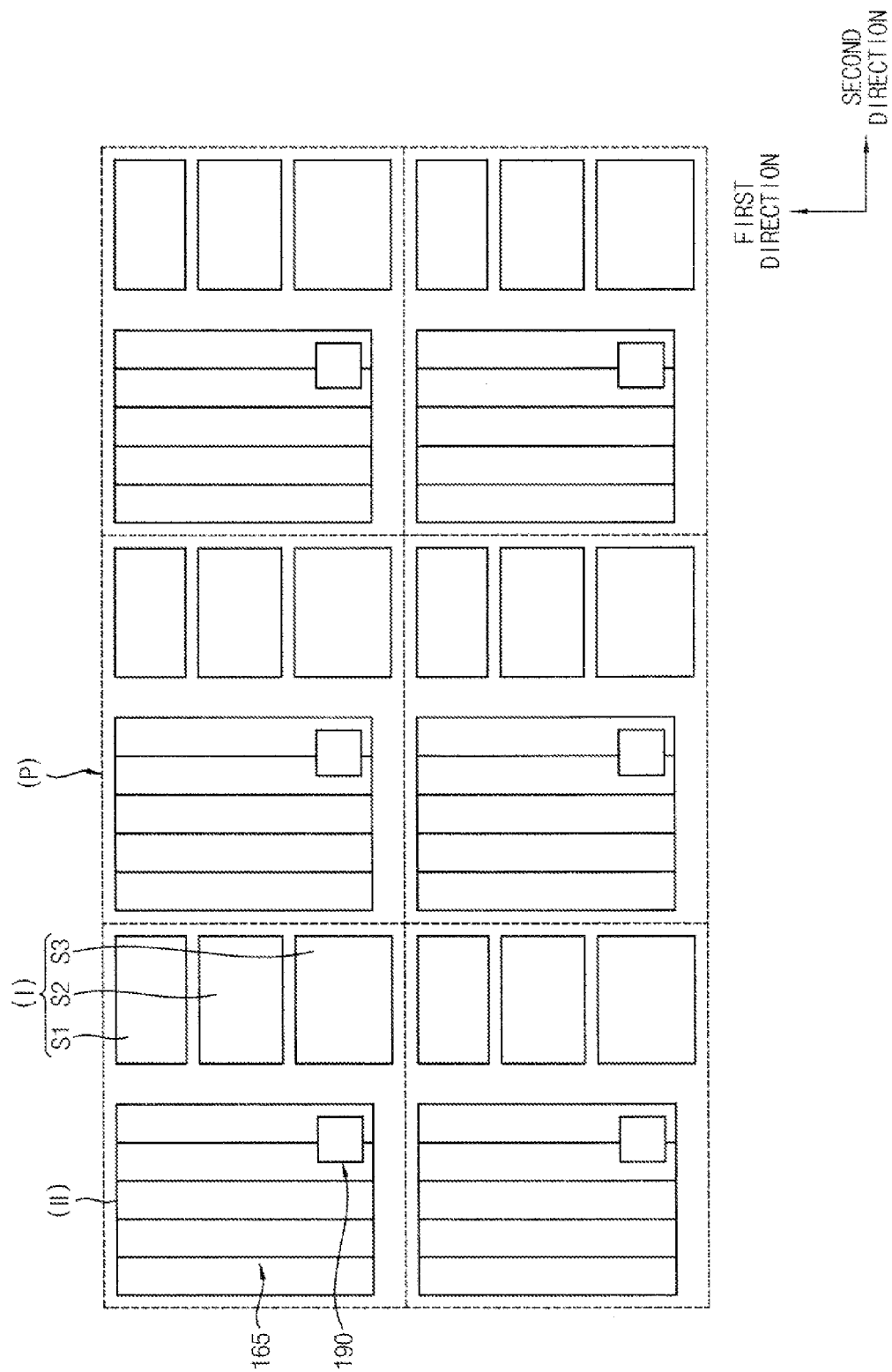
FIG. 14 is a top plan view illustrating exemplary embodiments of an OLED device in accordance with the invention.
Figure 15:
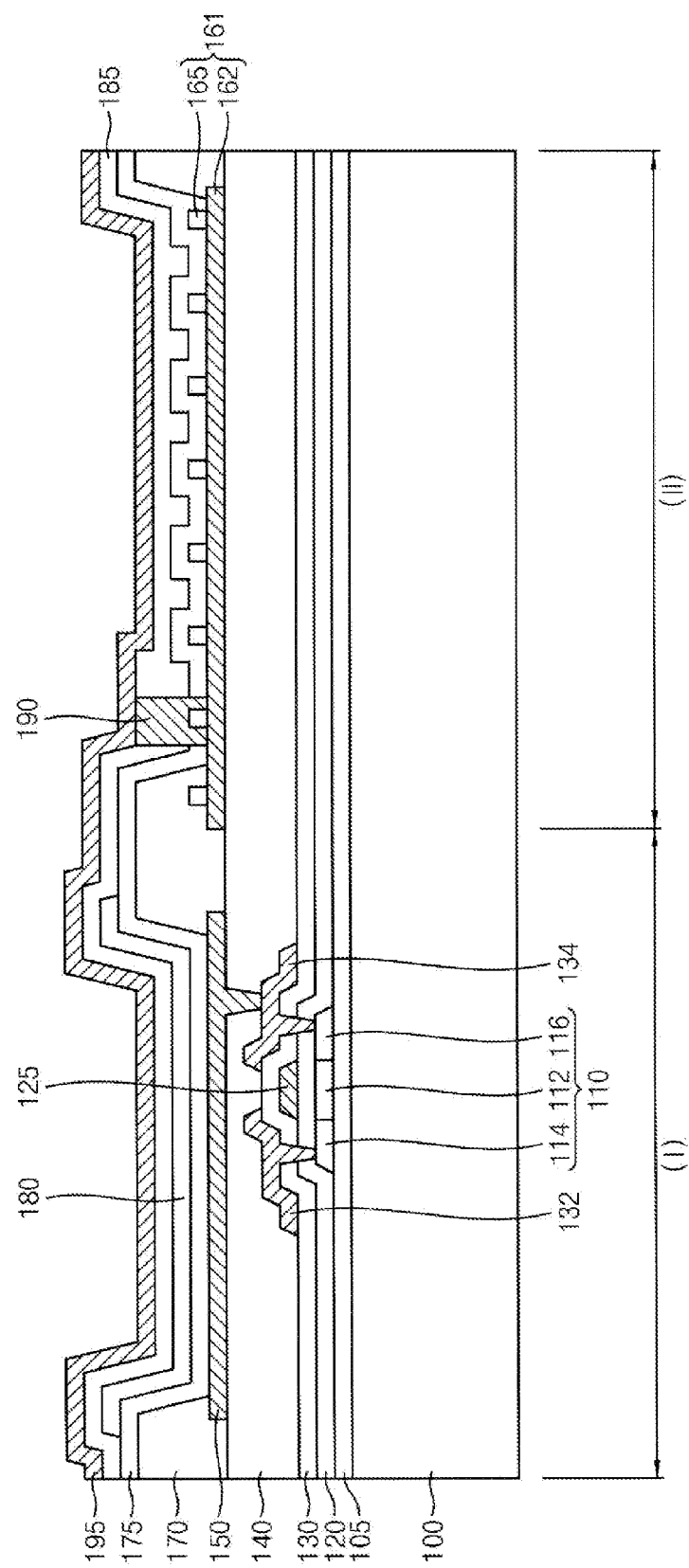
FIG. 15 is a cross-sectional view illustrating exemplary embodiments of an OLED device in accordance with the invention.
Figure 16:
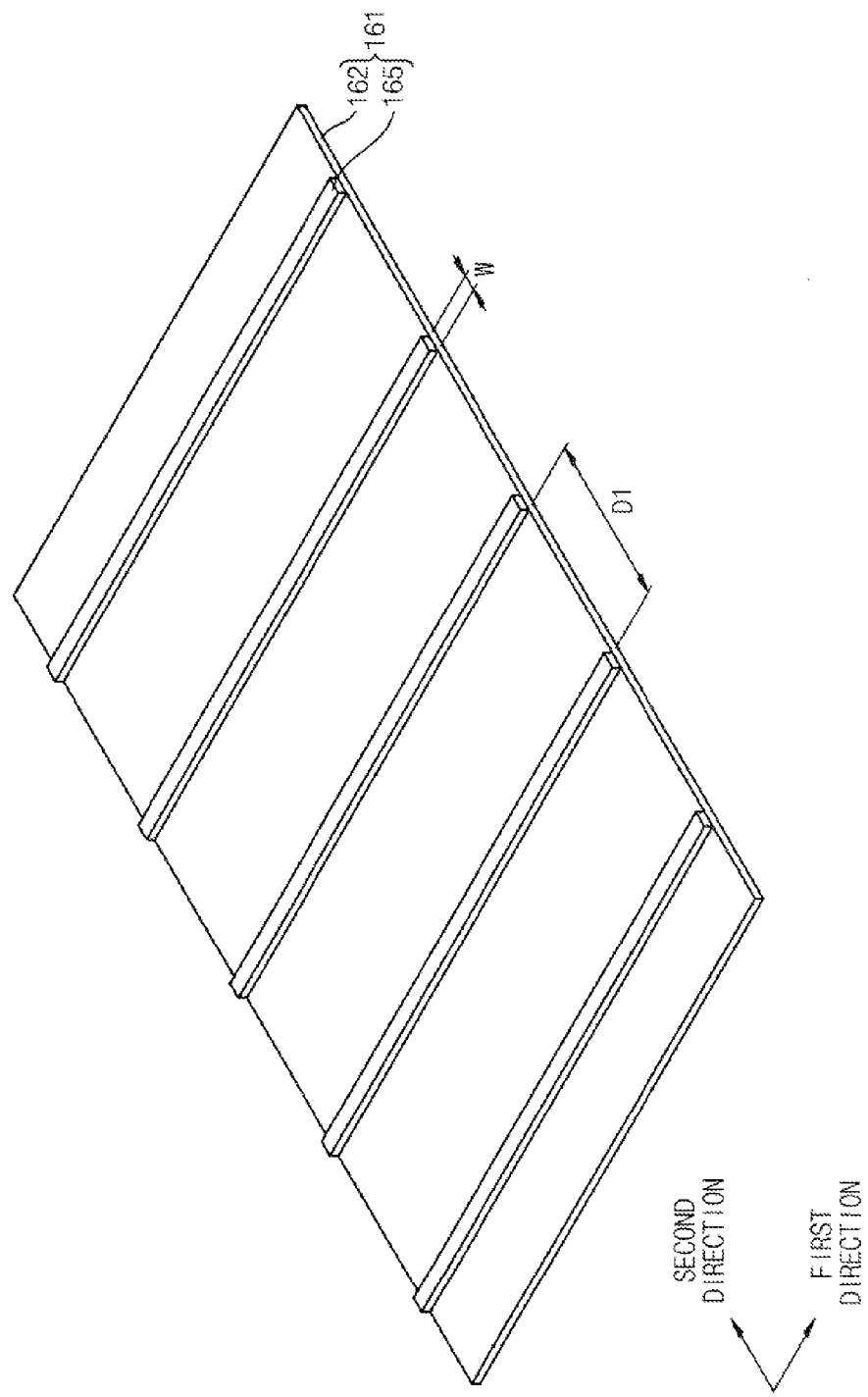
FIG. 16 is a perspective view illustrating exemplary embodiments of an auxiliary electrode of an OLED device in accordance with the invention.

FIG. 14 is a top plan view illustrating an OLED device in accordance with exemplary embodiments. FIG. 15 is a cross-sectional view illustrating an OLED device in accordance with exemplary embodiments. FIG. 16 is a perspective view illustrating an auxiliary electrode of an OLED device in accordance with exemplary embodiments.

The OLED device may include a first substrate 100, a switching device, a first electrode 150, the auxiliary electrode 161, a light emitting structure and a second electrode 195 as illustrated with reference to FIGS. 2 to 4.

The auxiliary electrode 161 may be disposed on a via insulation layer 140 in a second area II. The auxiliary electrode 161 may include a conductive layer 162 and a conductive pattern 165.

The conductive layer 162 may include substantially the same material as that of the first electrode 150. The conductive layer 162 may have substantially the same thickness as the first electrode 150.

The conductive pattern 165 may be defined on the conductive layer 162. The conductive pattern 165 may include a material having a resistivity not greater than that of the conductive layer 162.

The conductive pattern 165 may have an arrangement including, e.g., wires that may extend in a first direction. The wires may be spaced apart from each other in a second direction. The first and second directions are parallel to a top surface of the first substrate 100, and the second direction is perpendicular to the first direction.

Each of the wires of the conductive pattern 165 may have a first width W. The wires may be spaced apart from each other by a first distance D1.

An electrical resistance of the auxiliary electrode 161 including the conductive layer 162 and the conductive pattern 165 may be calculated by, e.g., Equations 4 and 5 below.

$$\frac{1}{R_{electrode}} = \frac{1}{R_{plate}} + \frac{1}{R_{pattern}} \qquad \text{[Equation 4]}$$

(Here, the value $R_{electrode}$ is the electrical resistance of the auxiliary electrode 161, the value $R_{plate}$ is an electrical resistance of the conductive layer 162, and the value $R_{pattern}$ is an electrical resistance of the conductive pattern 165.)

$$R_{pattern} = R_{sheet,pattern} \times \left(\frac{W}{W+D1}\right) \qquad \text{[Equation 5]}$$

(Here, the value $R_{sheet, pattern}$ is a sheet resistance of the conductive pattern 165 and is determined by component materials and a thickness of the conductive pattern 165. The value W is a width of each wire of the conductive pattern 165, and the value D1 is a distance between neighboring wires of the conductive pattern 165.)

The electrical resistance of the auxiliary electrode 161 may be reduced by the conductive pattern 165.

A contact 190 may be in direct contact with the auxiliary electrode 161 through the light emitting structure. In an exemplary embodiment, the contact 190 may electrically connect the auxiliary electrode 161 and the second electrode 195, for example.

Therefore, an electrical resistance of the second electrode 195 may be reduced by the connection with the auxiliary electrode 161.

Figure 17:
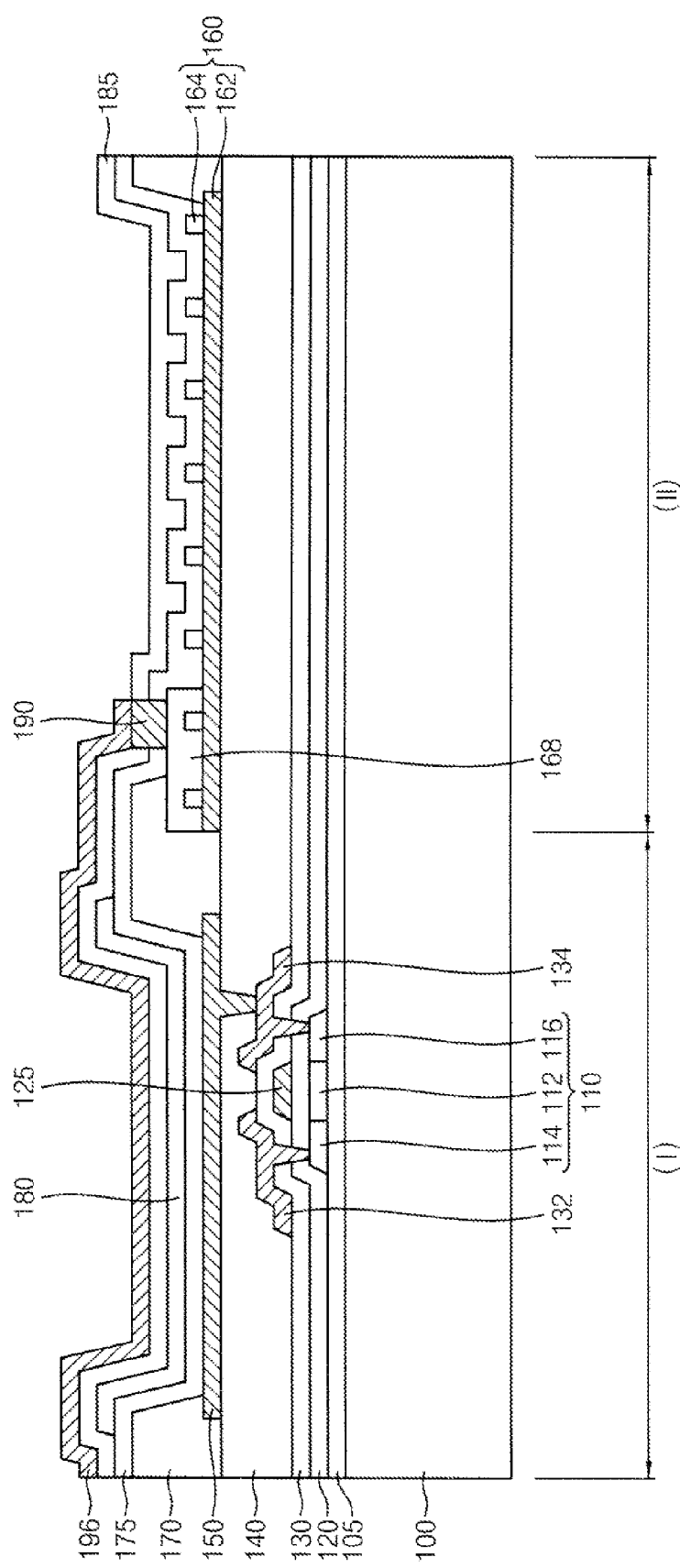
FIG. 17 is a cross-sectional view illustrating exemplary embodiments of an OLED device in accordance with the invention.

FIG. 17 is a cross-sectional view illustrating an OLED device in accordance with exemplary embodiments.

The OLED device may include a first substrate 100, a switching device, a first electrode 150, an auxiliary electrode 160, a light emitting structure and the second electrode 196 as illustrated in FIGS. 2 to 4.

The second electrode 196 may be disposed on a first area I. In an exemplary embodiment, the second electrode 196 may not be disposed on a second area II or may be partially disposed on the second area II, for example. Therefore, a transmittance of a transmission region in the second area II may not be reduced by the second electrode 196. However, the second electrode 196 may be patterned, so that an electrical resistance of the second electrode 196 may be increased.

In exemplary embodiments, the second electrode 196 may be electrically connected to the auxiliary electrode 160 through a contact 190 and an auxiliary wiring 168. Therefore, the electrical resistance of the second electrode 196 may be reduced.

Although a few exemplary embodiments of the pixel and the substrate including the pixel for the OLED device have been described with reference to the figures, those skilled in the art will readily appreciate that many modifications are possible in the exemplary embodiments without materially departing from the novel teachings and advantages of the invention.

The invention may be applied to any electronic device including an OLED device. In an exemplary embodiment, the invention may be applied to various electronic devices/systems such as a computer, a laptop, a digital camera, a video camcorder, a cellular phone, a smart phone, a smart pad, a PMP, a PDA, an MP3 player, a navigation system, a video phone, a monitoring system, a tracking system, a motion detecting system, an image stabilization system, etc, for example.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device, comprising:
   a substrate including a plurality of pixel areas, each of the plurality of pixel areas including a light emitting region and a transmission region;
   a first electrode disposed on the light emitting region of the substrate;
   a second electrode opposing the first electrode;
   a light emitting structure which is disposed on both the light emitting region and the transmission region of the substrate and disposed between the first electrode and the second electrode, the light emitting structure comprising an organic light emitting layer which is disposed on the light emitting region of the substrate;
   an auxiliary electrode which is disposed on the transmission region of the substrate and electrically connected to and physically separated from the second electrode; and
   a contact electrically connecting the second electrode and the auxiliary electrode through the light emitting structure.

2. The organic light emitting display device of claim 1, wherein the auxiliary electrode includes a conductive layer and a conductive pattern.

3. The organic light emitting display device of claim 2, wherein the conductive layer and the first electrode include the same material.

4. The organic light emitting display device of claim 2, wherein the conductive layer and the first electrode include at least one of indium tin oxide, indium zinc oxide, zinc oxide, magnesium oxide, titanium oxide, graphene, a carbon nanotube, PEDOT:PSS and a conductive polymer material.

5. The organic light emitting display device of claim 2, wherein bottom surfaces of the conductive layer and the first electrode are on the same plane, and the conductive layer and the first electrode are spaced apart from each other.

6. The organic light emitting display device of claim 2, wherein the conductive pattern includes a plurality of wires extending in a first direction which is parallel to a top surface of the substrate, and
   the plurality of wires is spaced apart from each other in a second direction which is perpendicular to the first direction and parallel to the top surface of the substrate.

7. The organic light emitting display device of claim 2, wherein the conductive pattern includes a plurality of wires extending in a first direction and a second direction to cross each other, and
   the first direction and the second direction are parallel to a top surface of the substrate and perpendicular to each other.

8. The organic light emitting display device of claim 7, wherein a width of each wire among the plurality of wires is less than a distance between neighboring wires among the plurality of wires.

9. The organic light emitting display device of claim 7, wherein the conductive pattern has a grid arrangement.

10. The organic light emitting display device of claim 2, wherein the conductive pattern includes a material having a resistivity less than that of the conductive layer.

11. The organic light emitting display device of claim 2, wherein the conductive pattern includes at least one of graphene, a carbon nanotube, PEDOT:PSS, a conductive polymer material, a metal nanowire, silver and gold.

12. The organic light emitting display device of claim 1, wherein the second electrode includes at least one of aluminum, silver and magnesium-silver.

13. The organic light emitting display device of claim 2, wherein the light emitting structure further comprising:
   a hole injection layer between the first electrode and the organic light emitting layer;
   a hole transport layer between the hole injection layer and the organic light emitting layer;
   an electron injection layer between the second electrode and the organic light emitting layer; and
   an electron transport layer between the electron injection layer and the organic light emitting layer.

14. The organic light emitting display device of claim 13, wherein the contact electrically connects the second electrode and the auxiliary electrode through the hole injection layer, the hole transport layer, the electron injection layer, and the electron transport layer.

15. The organic light emitting display device of claim 14, further comprising:
   an auxiliary wiring in direct contact with the conductive pattern, the auxiliary wiring being disposed between the contact and the auxiliary electrode.

16. The organic light emitting display device of claim 1, wherein the second electrode entirely covers the light emitting region and the transmission region.

17. The organic light emitting display device of claim 1, wherein the second electrode selectively covers the light emitting region so that the transmission region is exposed.

* * * * *